(12) United States Patent
Liao

(10) Patent No.: US 12,132,153 B2
(45) Date of Patent: Oct. 29, 2024

(54) LED PACKAGE STRUCTURE AND METHOD OF MANUFACTURING THE SAME, AND LED DISPLAY

(71) Applicant: Skiileux Electricity Inc., Taoyuan (TW)

(72) Inventor: Chien-Shou Liao, New Taipei (TW)

(73) Assignee: Skiileux Electricity Inc., Taoyuan (TW)

( * ) Notice: Subject to any disclaimer, the term of this patent is extended or adjusted under 35 U.S.C. 154(b) by 629 days.

(21) Appl. No.: 17/367,596

(22) Filed: Jul. 5, 2021

(65) Prior Publication Data

US 2022/0005984 A1   Jan. 6, 2022

(30) Foreign Application Priority Data

Jul. 6, 2020   (TW) ................................. 109122750

(51) Int. Cl.
| | | |
|---|---|---|
| *H01L 33/50* | (2010.01) | |
| *H01L 27/15* | (2006.01) | |
| *H01L 33/00* | (2010.01) | |
| *H01L 33/48* | (2010.01) | |
| *H01L 33/62* | (2010.01) | |

(52) U.S. Cl.
CPC .......... *H01L 33/504* (2013.01); *H01L 27/156* (2013.01); *H01L 33/005* (2013.01); *H01L 33/486* (2013.01); *H01L 33/62* (2013.01); *H01L 2933/0041* (2013.01); *H01L 2933/0066* (2013.01)

(58) Field of Classification Search
CPC ... H01L 33/504; H01L 27/156; H01L 33/005; H01L 33/486; H01L 33/62; H01L 2933/0041; H01L 2933/0066; H01L 33/44; H01L 33/507; H01L 2933/0091; H01L 33/502; H01L 25/0753; H01L 33/58; H01L 2933/0058; G09F 9/33
See application file for complete search history.

(56) References Cited

U.S. PATENT DOCUMENTS

| | | | |
|---|---|---|---|
| 10,403,789 B2* | 9/2019 | Cheng | ................... H01L 33/007 |
| 2018/0053882 A1* | 2/2018 | Cheng | ..................... H01L 33/58 |
| 2019/0064600 A1* | 2/2019 | Jang | .................. G02F 1/133504 |
| 2019/0189595 A1* | 6/2019 | Lee | ..................... H01L 25/0753 |

FOREIGN PATENT DOCUMENTS

| | | |
|---|---|---|
| CN | 111261665 A | 6/2020 |
| TW | M569497 U | 11/2018 |
| TW | 201933630 A | 8/2019 |
| TW | 201937762 A | 9/2019 |

* cited by examiner

*Primary Examiner* — Jonathan Han
(74) *Attorney, Agent, or Firm* — Winston Hsu

(57) ABSTRACT

An LED package structure and a method of manufacturing the same, and an LED display are provided. The method of manufacturing the LED package structure includes: providing a plurality of LED chips, each of the LED chips having two exposed conductive pads; forming a plurality of quantum dot material layers for respectively enclosing the LED chips; and respectively forming a plurality of blue light scattering material layers on the quantum dot material layers. The LED package structure includes the LED chip that has the two exposed conductive pads, the quantum dot material layer for enclosing the LED chip, and the blue light scattering material layer that is disposed on the quantum dot material layer.

12 Claims, 21 Drawing Sheets

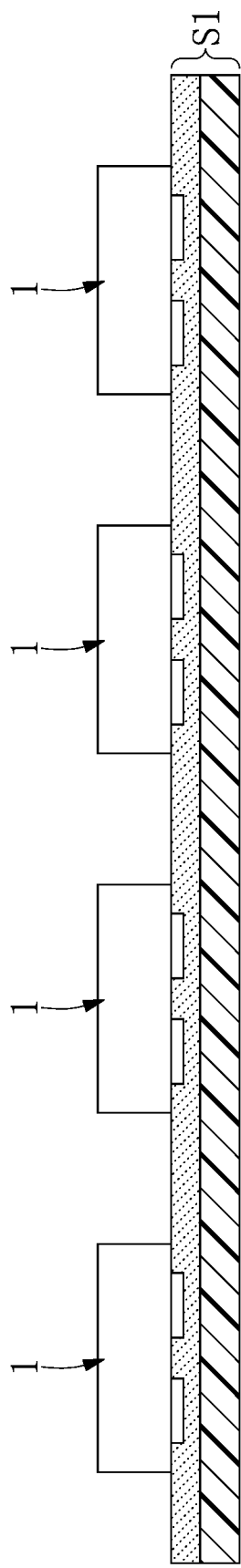
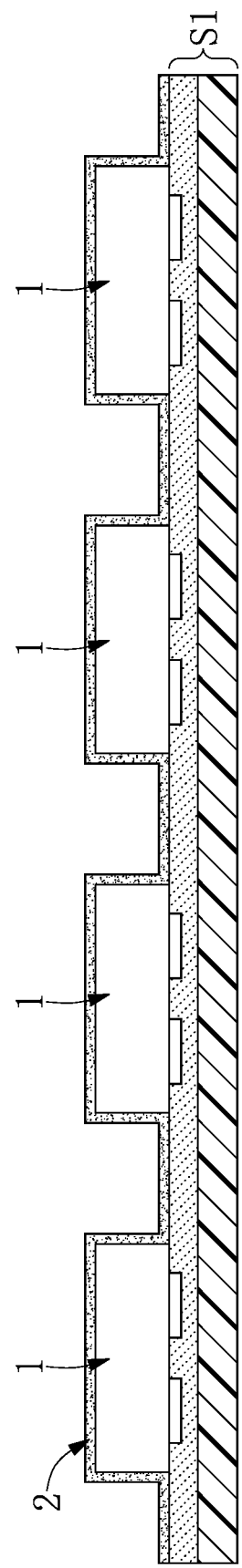
FIG. 2
FIG. 3

LED PACKAGE STRUCTURE AND METHOD OF MANUFACTURING THE SAME, AND LED DISPLAY

CROSS-REFERENCE TO RELATED PATENT APPLICATION

This application claims the benefit of priority to Taiwan Patent Application No. 109122750, filed on Jul. 6, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a method of manufacturing the same, and a display, and more particularly to an LED package structure and a method of manufacturing the same, and an LED display.

BACKGROUND OF THE DISCLOSURE

In the related art, light-emitting diode (LED) chips have been widely used. However, there is still room for improvement in the related art for manufacturing and use of conventional LED chips.

SUMMARY OF THE DISCLOSURE

In response to the above-referenced technical inadequacy, the present disclosure provides an LED package structure and a method of manufacturing the same, and an LED display.

In one aspect, the present disclosure provides a method of manufacturing an LED package structure, which includes: providing a plurality of LED chips, each of the LED chips having two exposed conductive pads; forming a plurality of quantum dot material layers for respectively enclosing the LED chips; and respectively forming a plurality of blue light scattering material layers on the quantum dot material layers. The LED package structure includes the LED chip, the quantum dot material layer, and the blue light scattering material layer.

In another aspect, the present disclosure provides an LED package structure including an LED chip having two exposed conductive pads, a quantum dot material layer enclosing the LED chip, and a blue light scattering material layer disposed on the quantum dot material layer.

In yet another aspect, the present disclosure provides an LED display including a circuit substrate, a plurality of LED groups, and a black matrix. The LED groups are disposed on the circuit substrate and electrically connected to the circuit substrate. The black matrix is disposed on the circuit substrate for surrounding each of the LED groups. The LED group is one of a blue LED chip or an LED package structure. When the LED group is the LED package structure, the LED package structure includes an LED chip having two exposed conductive pads, a quantum dot material layer enclosing the LED chip, and a blue light scattering material layer disposed on the quantum dot material layer.

Therefore, in the LED package structure and the LED display provided by the present disclosure, by virtue of "the quantum dot material layer for enclosing the LED chip" and "the blue light scattering material layer being disposed on the quantum dot material layer", a blue light scattering effect of the present disclosure can be increased by using the blue light scattering material layer, thereby directly increasing a wavelength conversion efficiency of a blue light passing through the quantum dot material layer. It should be noted that the blue light scattering material layer can be replaced by a blue light absorbing material layer for increasing a blue light absorbing effect, so that a possibility of the blue light passing through the blue light absorbing material layer can be reduced and the wavelength conversion efficiency provided by the quantum dot material layer can be indirectly increased.

Furthermore, in the method of manufacturing the LED package structure provided by the present disclosure, by virtue of "forming a plurality of quantum dot material layers for respectively enclosing the LED chips" and "respectively forming a plurality of blue light scattering material layers on the quantum dot material layers", the blue light scattering effect of the present disclosure can be increased by using the blue light scattering material layer, thereby directly increasing the wavelength conversion efficiency of the blue light passing through the quantum dot material layer. It should be noted that the blue light scattering material layer can be replaced by the blue light absorbing material layer for increasing the blue light absorbing effect, so that the possibility of the blue light passing through the blue light absorbing material layer can be reduced and the wavelength conversion efficiency provided by the quantum dot material layer can be indirectly increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 2 is a schematic cross-sectional view of step S100 of the method of manufacturing the LED package structure according to the first embodiment of the present disclosure;

FIG. 3 is a schematic cross-sectional view of step S102 of the method of manufacturing the LED package structure according to the first embodiment of the present disclosure;

DETAILED DESCRIPTION OF THE EXEMPLARY EMBODIMENTS

Figure 1:
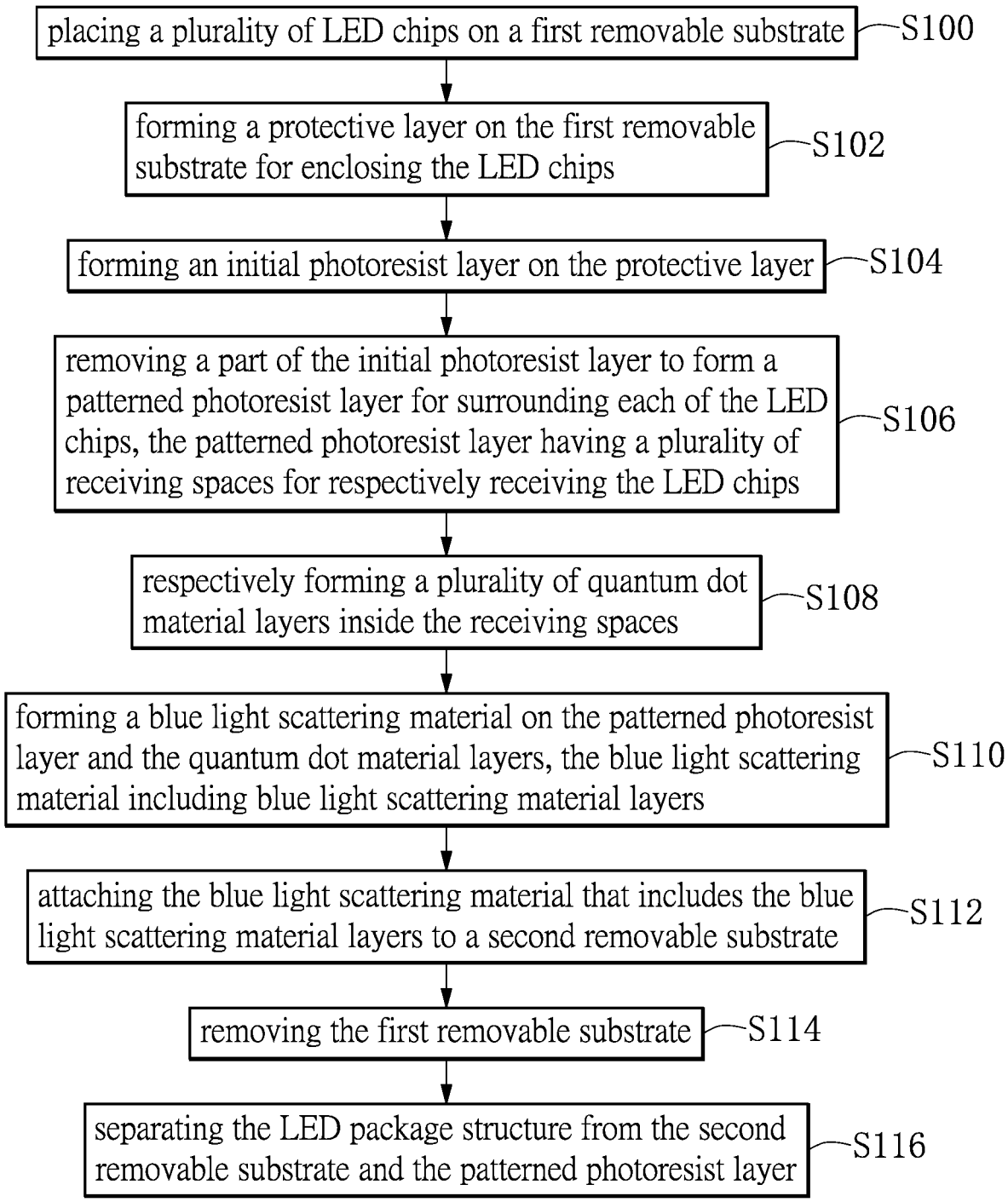
FIG. 1 is a flowchart of a method of manufacturing an LED package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 33, the present disclosure provides a method of manufacturing an LED package structure, which includes: providing a plurality of LED chips 1, each of the LED chips 1 having two exposed conductive pads 100; next, forming a plurality of quantum dot material layers 3 for respectively enclosing the LED chips 1; and respectively forming a plurality of blue light scattering material layers 4 on the quantum dot material layers 3. In addition, an LED package structure S includes the LED chip 1, the quantum dot material layer 3, and the blue light scattering material layer 4. It should be noted that the blue light scattering material layer 4 can be replaced by a blue light absorbing material layer.

Figure 11:
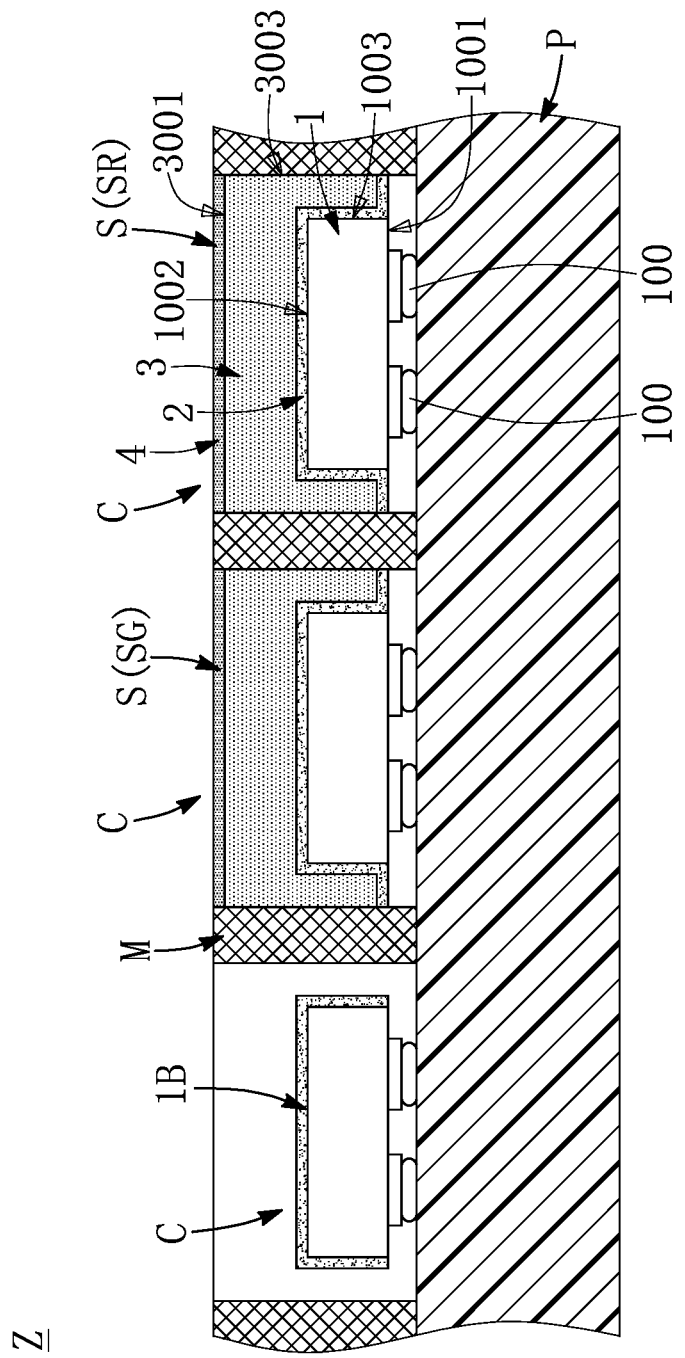
FIG. 11 is a schematic cross-sectional view of the LED package structure and an LED display according to the first embodiment of the present disclosure.
Figure 20:
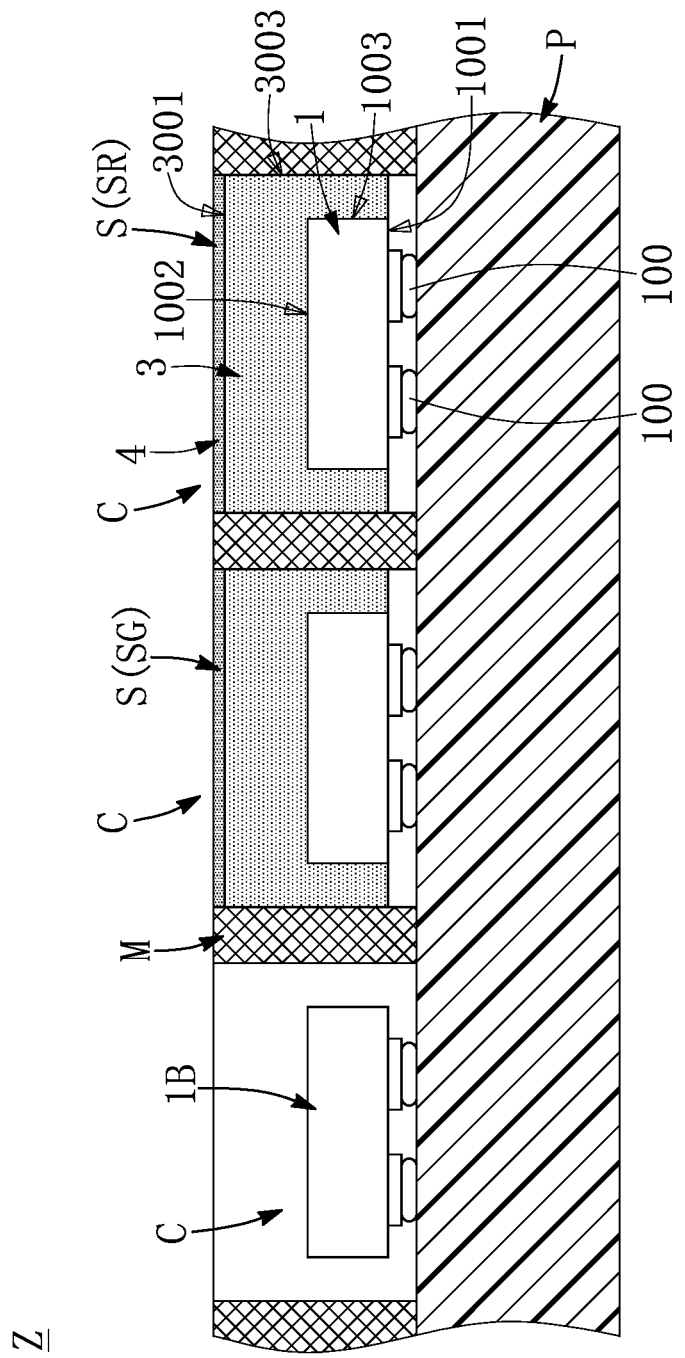
FIG. 20 is a schematic cross-sectional view of the LED package structure and an LED display according to the second embodiment of the present disclosure.
Figure 33:
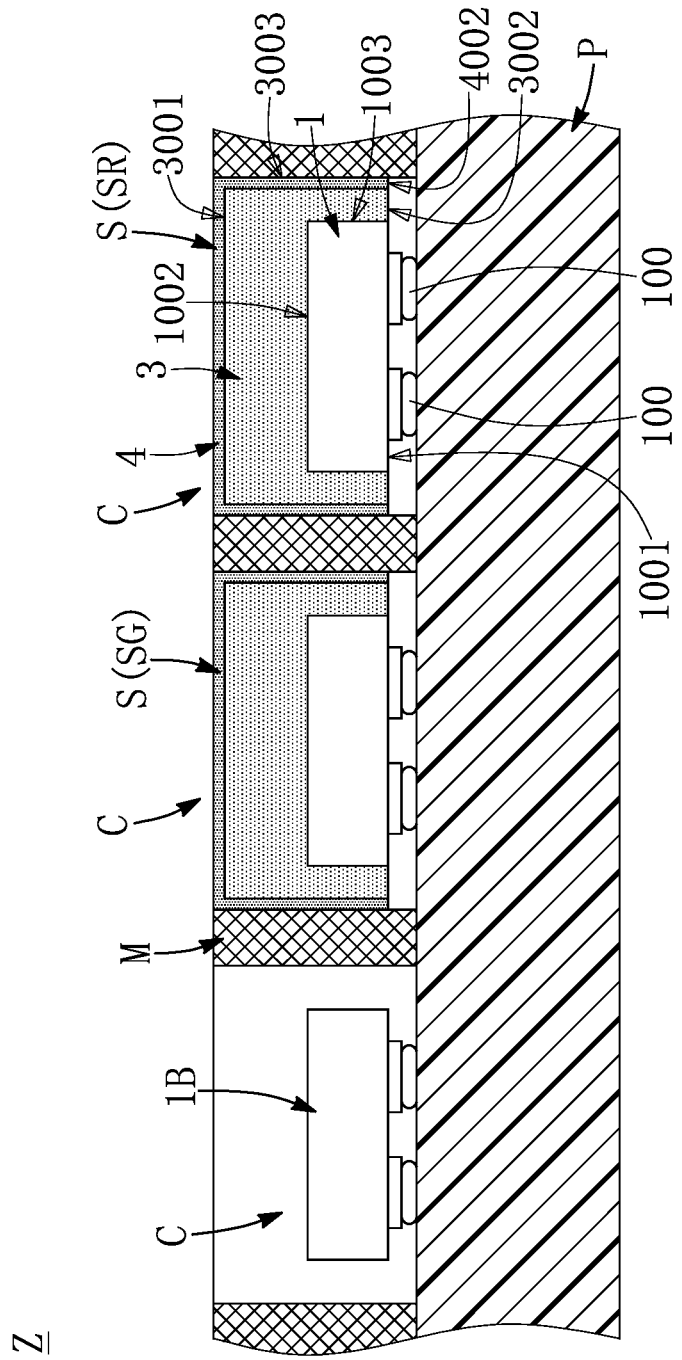
FIG. 33 is a schematic cross-sectional view of the LED package structure and an LED display according to the third embodiment of the present disclosure.

Referring to FIG. 11, FIG. 20 and FIG. 33, the present disclosure provides an LED package structure S including an LED chip 1, a quantum dot material layer 3, and a blue light scattering material layer 4. In addition, the LED chip 1 has two exposed conductive pads 100, the quantum dot material layer 3 is used for enclosing the LED chip 1, and the blue light scattering material layer 4 is disposed on the quantum dot material layer 3. It should be noted that the blue light scattering material layer 4 can be replaced by a blue light absorbing material layer.

Referring to FIG. 11, FIG. 20 and FIG. 33, the present disclosure provides an LED display Z including a circuit substrate P, a plurality of LED groups C, and a black matrix M. The LED groups C are disposed on the circuit substrate P and electrically connected to the circuit substrate P, and the black matrix M is disposed on the circuit substrate P for surrounding each of the LED groups C. In addition, the LED group C can be one of a blue LED chip 1B or an LED package structure S. When the LED group C is the LED package structure S, the LED package structure S includes an LED chip 1 having two exposed conductive pads 100, a quantum dot material layer 3 enclosing the LED chip 1, and a blue light scattering material layer 4 disposed on the quantum dot material layer 3. It should be noted that use of the blue light scattering material layer 4 allows a blue light to be blocked and scattered downwardly, so as to prevent the blue light from projecting out of the LED package structure S (or the blue light scattering material layer 4). The blue light scattering material layer 4 can be replaced by a blue light absorbing material layer for absorbing the blue light and preventing the blue light from projecting out of the LED package structure S. For example, the blue light absorbing material layer can be a blue light attenuating material for attenuating the blue light, or a blue light inhibiting material for inhibiting or blocking the blue light.

First Embodiment

Figure 4:
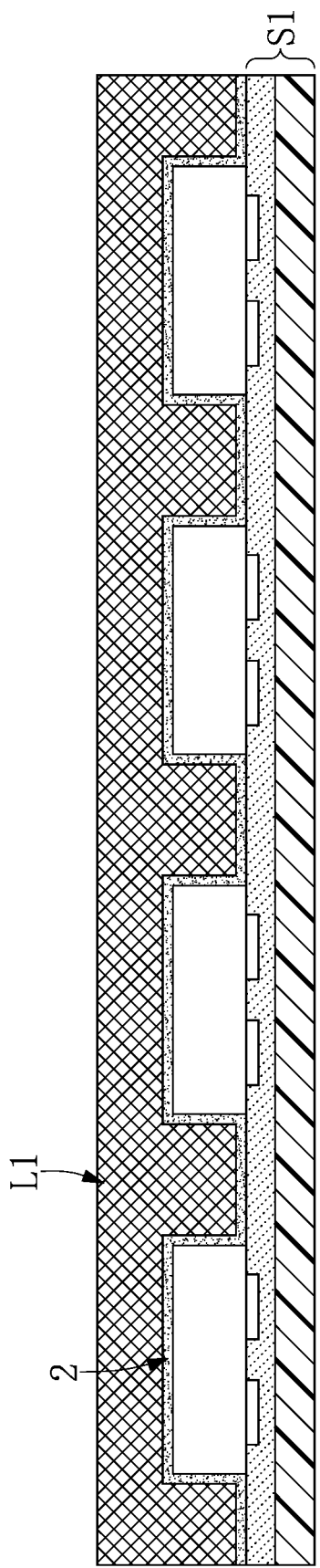
FIG. 4 is a schematic cross-sectional view of step S104 of the method of manufacturing the LED package structure according to the first embodiment of the present disclosure.
Figure 5:
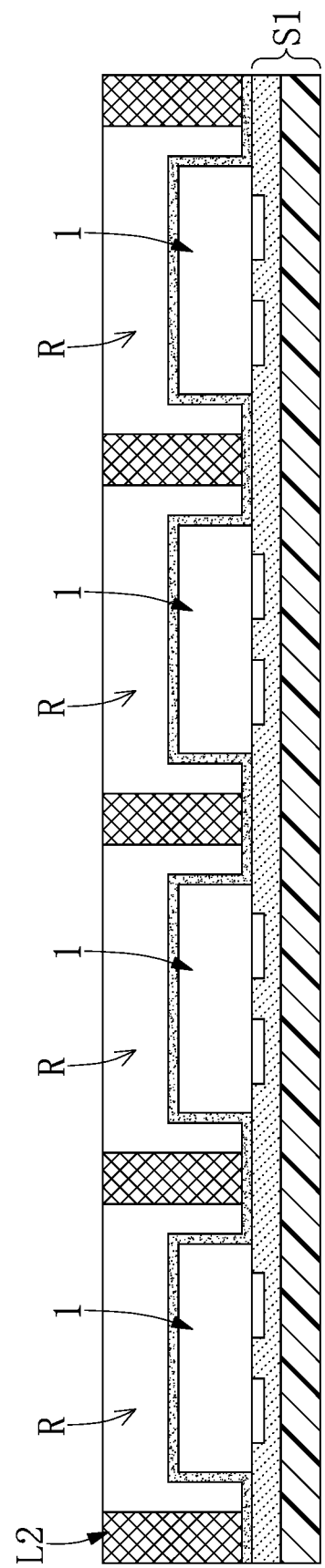
FIG. 5 is a schematic cross-sectional view of step S106 of the method of manufacturing the LED package structure according to the first embodiment of the present disclosure.
Figure 6:
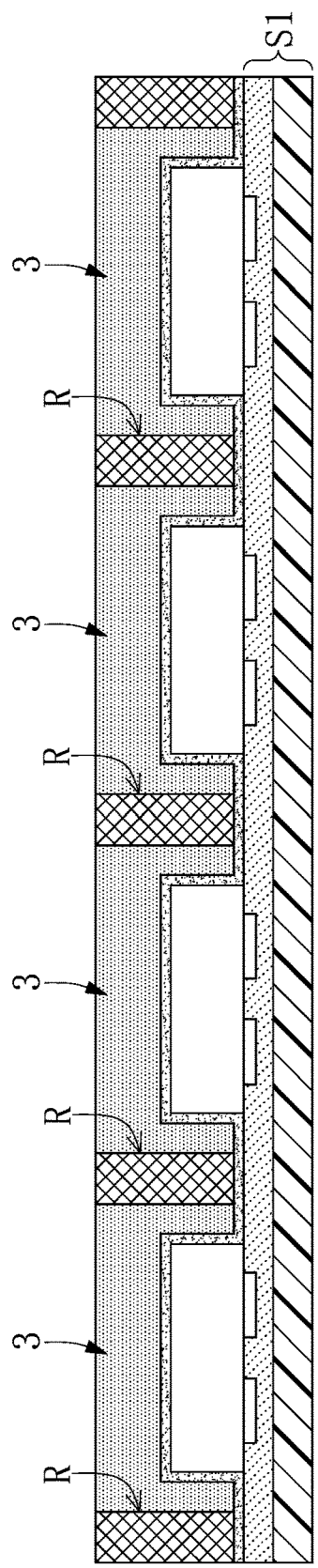
FIG. 6 is a schematic cross-sectional view of step S108 of the method of manufacturing the LED package structure according to the first embodiment of the present disclosure.
Figure 7:
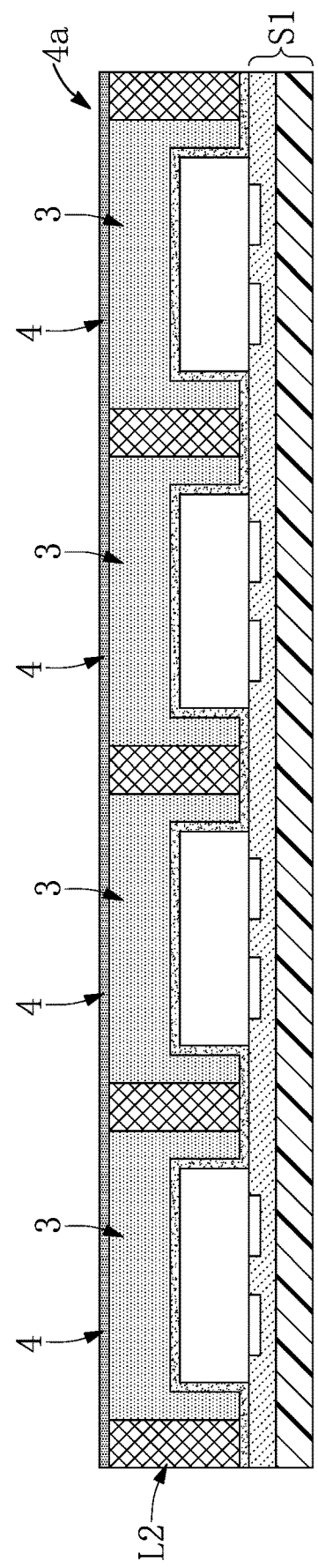
FIG. 7 is a schematic cross-sectional view of step S110 of the method of manufacturing the LED package structure according to the first embodiment of the present disclosure.
Figure 8:
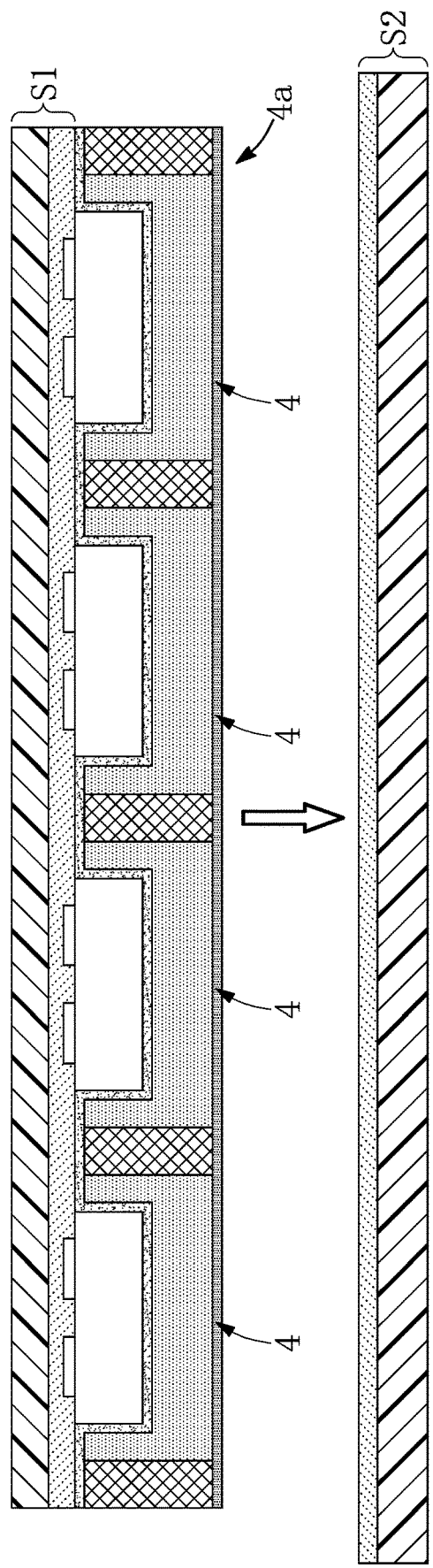
FIG. 8 is a schematic cross-sectional view showing the method of manufacturing the LED package structure before step S112 is performed according to the first embodiment of the present disclosure.
Figure 9:
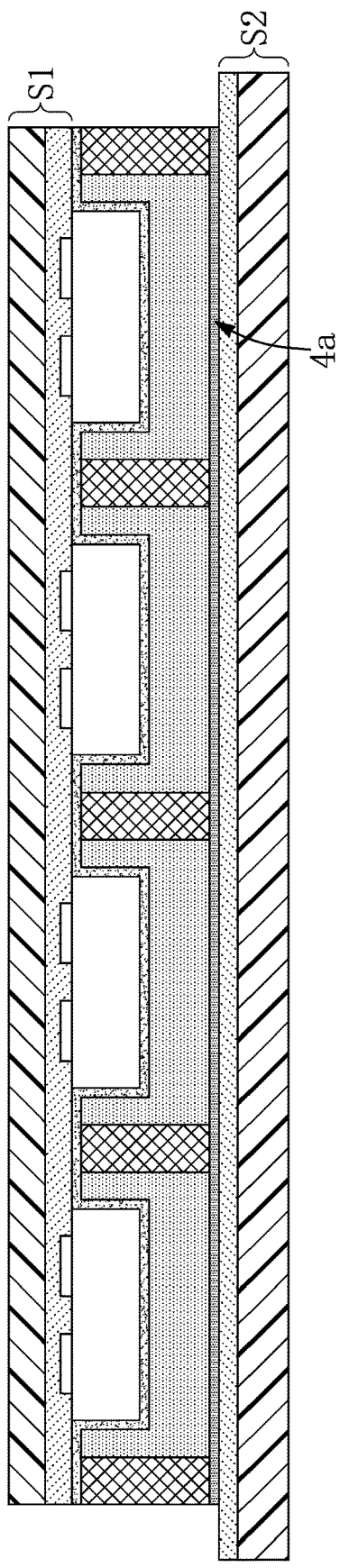
FIG. 9 is a schematic cross-sectional view showing the method of manufacturing the LED package structure after step S112 is performed according to the first embodiment of the present disclosure.
Figure 10:
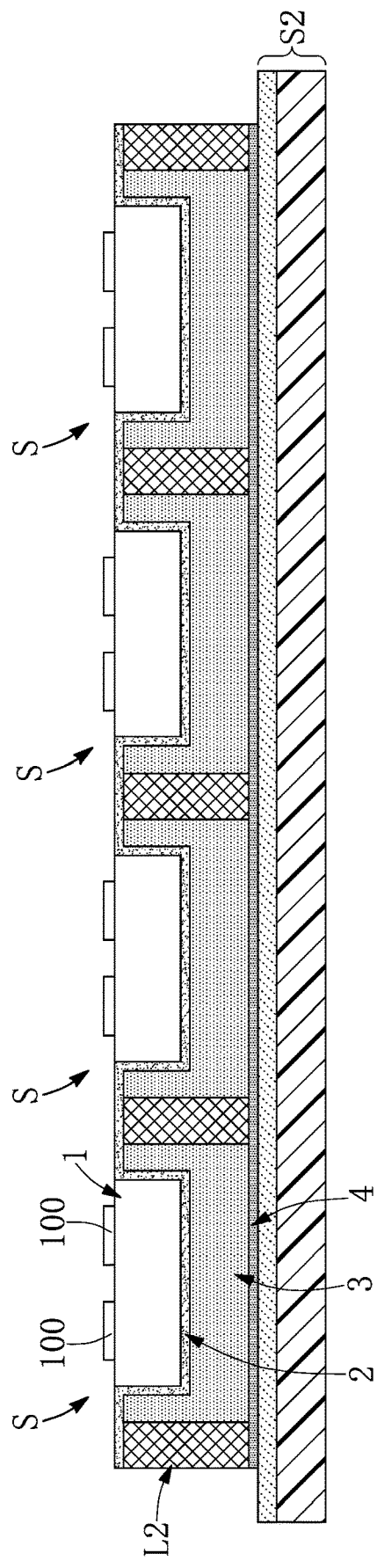
FIG. 10 is a schematic cross-sectional view of step S114 of the method of manufacturing the LED package structure according to the first embodiment of the present disclosure.

Referring to FIG. 1 to FIG. 11, a first embodiment of the present disclosure provides a method of manufacturing an LED package structure S, which includes: firstly, referring to FIG. 1 and FIG. 2, placing a plurality of LED chips 1 on a first removable substrate S1 (step S100); next, referring to FIG. 1 and FIG. 3, forming a protective layer 2 on the first removable substrate 51 for enclosing the LED chips 1 (step S102); then, referring to FIG. 1 and FIG. 4, forming an initial photoresist layer L1 on the protective layer 2 (step S104); afterwards, referring to FIG. 1, FIG. 4 and FIG. 5, removing a part of the initial photoresist layer L1 to form a patterned photoresist layer L2 for surrounding each of the LED chips 1, the patterned photoresist layer L2 having a plurality of receiving spaces R for respectively receiving the LED chips 1 (step S106); next, referring to FIG. 1 and FIG. 6, respectively forming a plurality of quantum dot material layers 3 inside the receiving spaces R (step S108); then, referring to FIG. 1 and FIG. 7, forming a blue light scattering material 4a (or a blue light absorbing material) on the patterned photoresist layer L2 and the quantum dot material layers 3, the blue light scattering material 4a including blue light scattering material layers 4 (step S110); afterwards, referring to FIG. 1, FIG. 8 and FIG. 9, attaching the blue light scattering material 4a that includes the blue light scattering material layers 4 to a second removable substrate S2 (step S112); next, referring to FIG. 1, FIG. 9 and FIG. 10, removing the first removable substrate S1 (step S114); and referring to FIG. 1, FIG. 10 and FIG. 11, separating the LED package structure S from the second removable substrate S2 and the patterned photoresist layer L2 (step S116). In addition, the LED package structure S can be disposed on a circuit substrate P through conductive materials (such as solder balls or solder paste).

For example, the first removable substrate S1 includes a first carrying substrate and a first adhesive layer (such as a UV release film or a thermal release film) disposed on the first carrying substrate, and the second removable substrate S2 includes a second carrying substrate and a second adhesive layer (such as a UV release film or a thermal release film) disposed on the second carrying substrate. In addition, the LED chip 1 can be any blue LED chip for generating a blue light, and the protective layer 2 can be a hydrophilic inorganic curing layer having a thickness about 100 nm, so as to protect the first adhesive layer of the first removable substrate S1 from contacting the initial photoresist layer L1 that is made of a hydrophobic material. Moreover, when quantum dot glue is filled and solidified by curing in the receiving space R, the quantum dot material layers 3 are formed. As such, the quantum dot material layers 3 can be formed by hydrophilic quantum dot glue. Furthermore, the blue light scattering material layer 4 can be made of the blue light scattering material 4a (such as $TiO_2$, $SiO_2$, or $ZrO_2$ etc.) that has a thickness ranging from 100 nm to 5 μm. Due to the blue light scattering material 4a, a blue light scattering effect of the present disclosure can be increased (that is to say, the blue light can be scattered by the blue light scattering material layer 4 and then travel back to the quantum dot material layers 3), thereby directly increasing a wavelength conversion efficiency of the blue light passing through the quantum dot material layer 3. It should be noted that the blue light scattering material layer 4 can be replaced by a blue light absorbing material layer (which is made of an organic material capable of increasing a blue light absorbing effect), or a mixture of the blue light scattering material 4a and the blue light absorbing material can be used, so that a possibility of the blue light passing through the blue light absorbing material layer can be reduced and the wavelength conversion efficiency provided by the quantum dot material layer 3 can be indirectly increased. Furthermore, in the step S116, the LED package structure S can be separated from the second removable substrate S2 and the patterned photoresist layer L2 by laser processing, the blue light scattering material layers 4 can also be separated from each other by removing a part of the blue light scattering material 4a, and the protective layer 2 can be divided into a plurality of sections. However, the aforementioned description is merely an example, and is not meant to limit the scope of the present disclosure.

Moreover, referring to FIG. 10 and FIG. 11, the first embodiment of the present disclosure further provides an LED package structure S including an LED chip 1, a quantum dot material layer 3, and a blue light scattering material layer 4. More particularly, the LED chip 1 has two exposed conductive pads 100, the quantum dot material layer 3 is used for enclosing the LED chip 1, and the blue light scattering material layer 4 is disposed on the quantum dot material layer 3. For example, the LED chip 1 has a bottom side 1001, a top side 1002, and a peripheral surface 1003 connected between the bottom side 1001 and the top side 1002, the top side 1002 and the peripheral surface 1003 of the LED chip 1 are covered by a protective layer 2, and the protective layer 2 is covered by the quantum dot material layer 3. In addition, the bottom side 1001 of the LED chip 1 is not covered by the protective layer 2, and the two conductive pads 100 are disposed on the bottom side 1001 of the LED chip 1. Moreover, a top surface 3001 of the quantum dot material layer 3 is covered by the blue light scattering material layer 4, and a peripheral surface 3003 of the quantum dot material layer 3 is not covered by the blue light scattering material layer 4. However, the aforementioned description is merely an example, and is not meant to limit the scope of the present disclosure.

Furthermore, as shown in FIG. 11, the first embodiment of the present disclosure further provides an LED display Z including a circuit substrate P, a plurality of LED groups C, and a black matrix M. More particularly, the LED groups C are disposed on the circuit substrate P and electrically connected to the circuit substrate P, the black matrix M is disposed on the circuit substrate P for surrounding each of the LED groups C, and the LED group C can be one of a blue LED chip 1B or an LED package structure S. Moreover, when the LED group C is the LED package structure S, the LED package structure S includes an LED chip 1 (such as a blue LED chip) having two exposed conductive pads 100, a quantum dot material layer 3 enclosing the LED chip 1, and a blue light scattering material layer 4 disposed on the quantum dot material layer 3. For example, when the LED package structure S is a red LED package structure SR, the LED chip 1 is a blue LED chip, and the quantum dot material layer 3 is a red quantum dot material layer. When the LED package structure S is a green LED package structure SG the LED chip 1 is a blue LED chip, and the quantum dot material layer 3 is a green quantum dot material layer. However, the aforementioned description is merely an example, and is not meant to limit the scope of the present disclosure.

Second Embodiment

Figure 12:
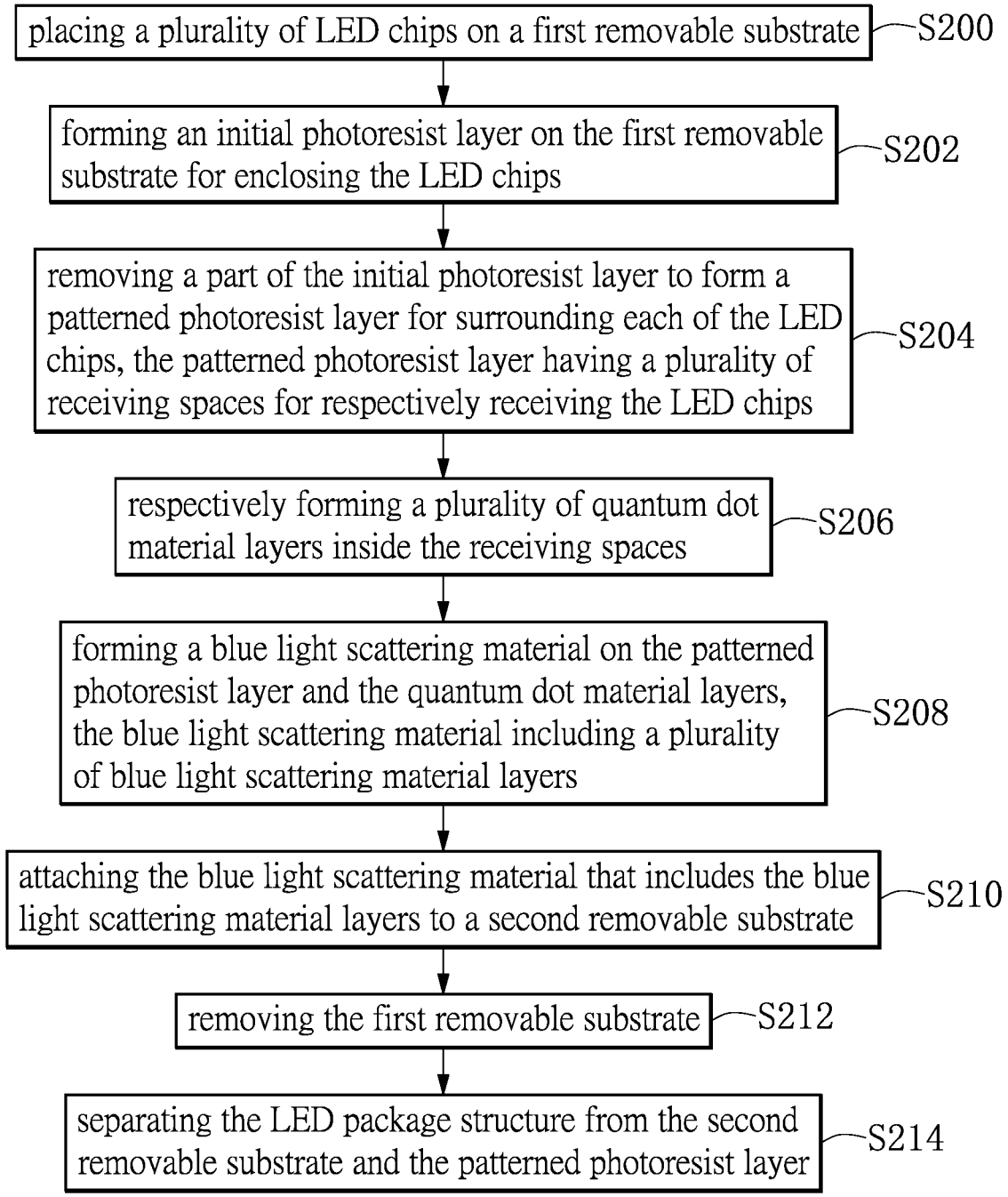
FIG. 12 is a flowchart of a method of manufacturing an LED package structure according to a second embodiment of the present disclosure.
Figure 13:
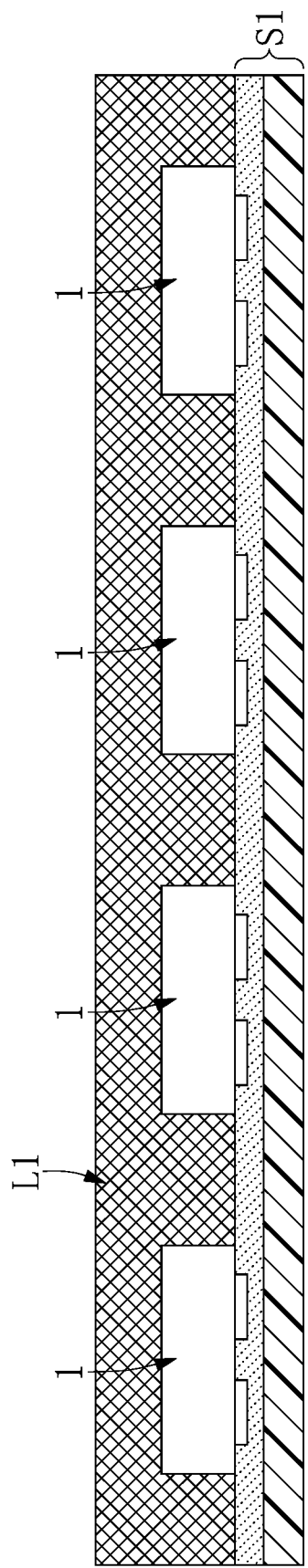
FIG. 13 is a schematic cross-sectional view of step S200 and step S202 of the method of manufacturing the LED package structure according to the second embodiment of the present disclosure.
Figure 14:
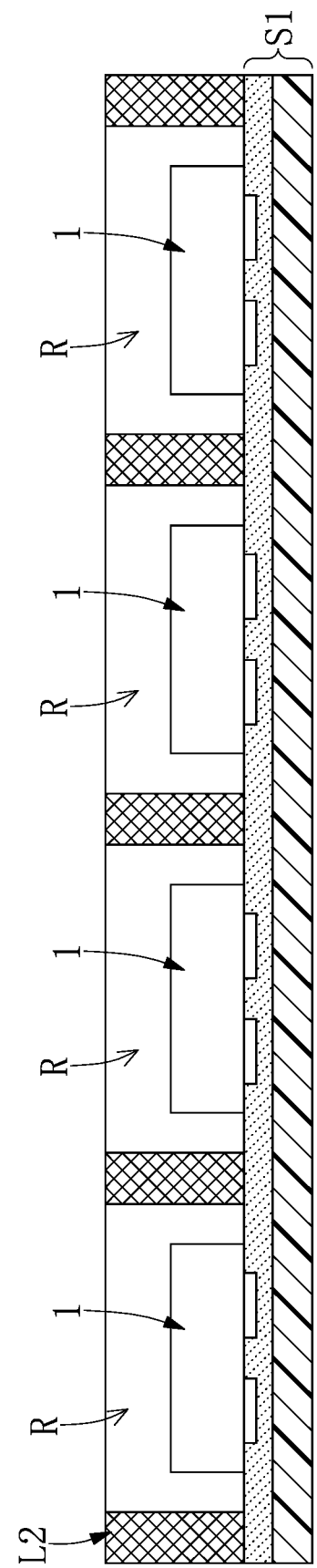
FIG. 14 is a schematic cross-sectional view of step S204 of the method of manufacturing the LED package structure according to the second embodiment of the present disclosure.
Figure 15:
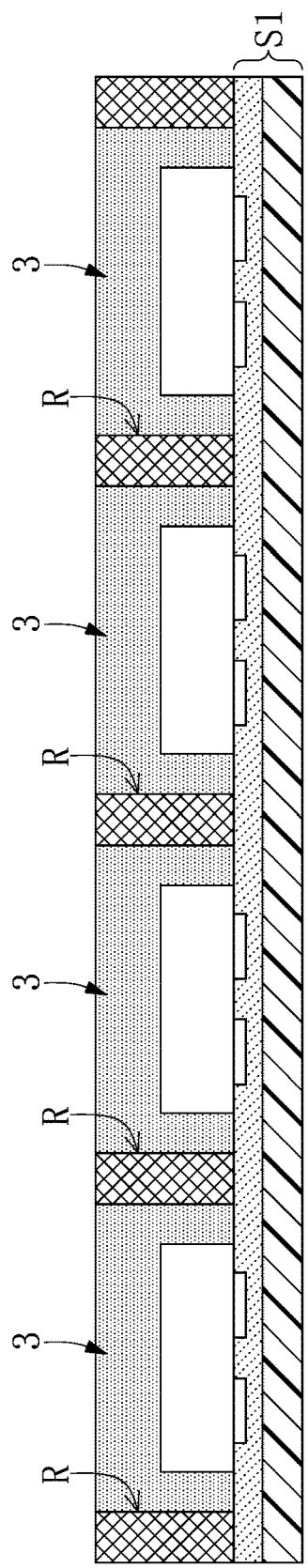
FIG. 15 is a schematic cross-sectional view of step S206 of the method of manufacturing the LED package structure according to the second embodiment of the present disclosure.
Figure 16:
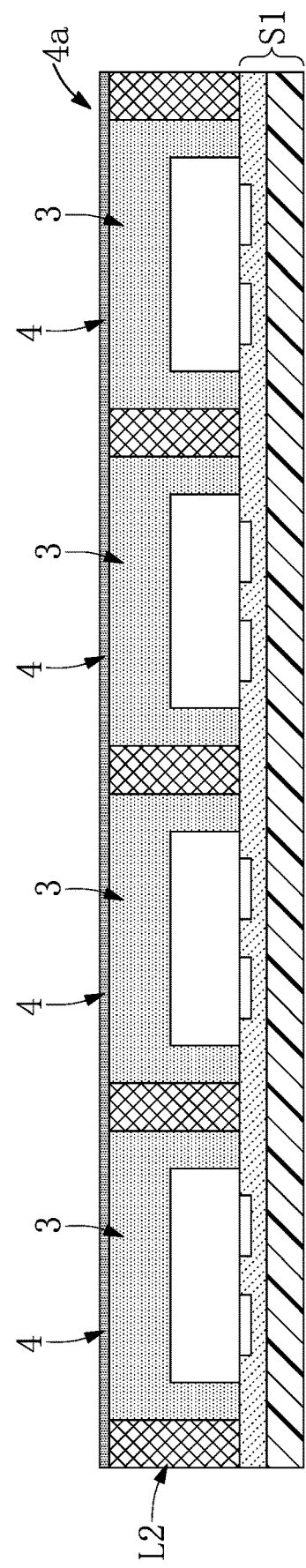
FIG. 16 is a schematic cross-sectional view of step S208 of the method of manufacturing the LED package structure according to the second embodiment of the present disclosure.
Figure 17:
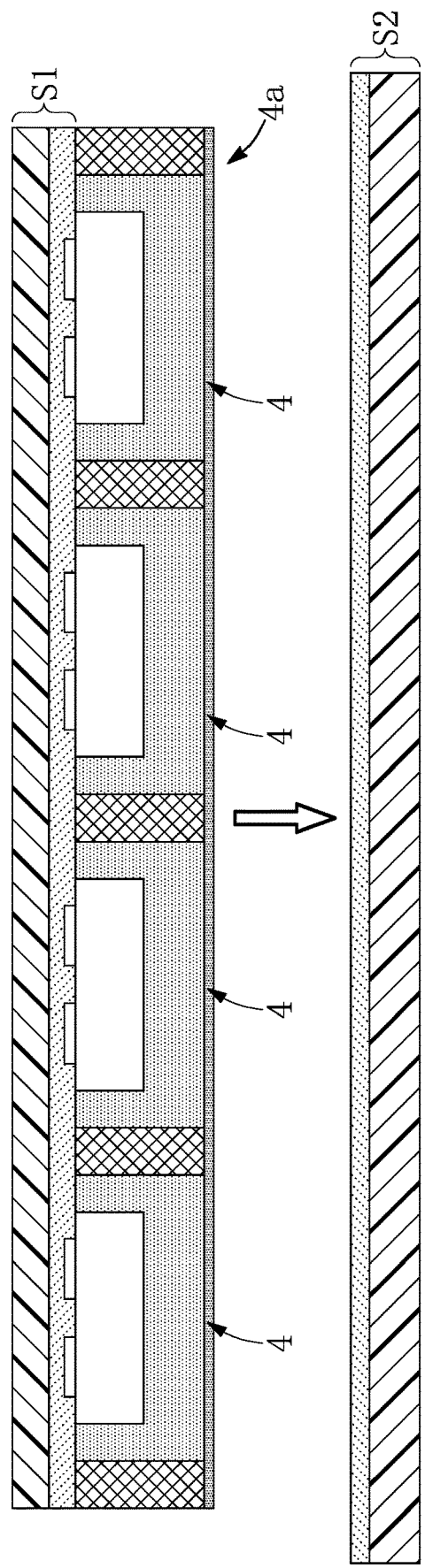
FIG. 17 is a schematic cross-sectional view showing the method of manufacturing the LED package structure before step S210 is performed according to the second embodiment of the present disclosure.
Figure 18:
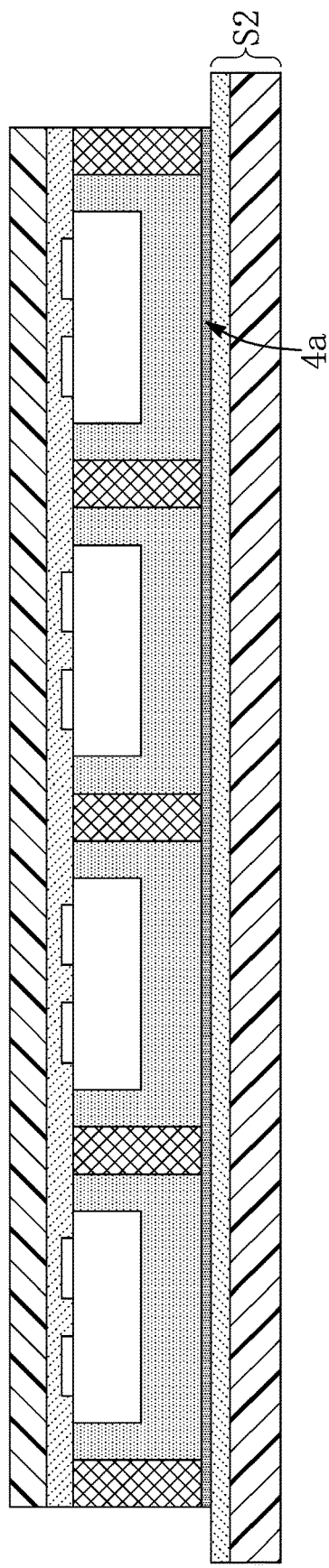
FIG. 18 is a schematic cross-sectional view showing the method of manufacturing the LED package structure after step S210 is performed according to the second embodiment of the present disclosure.
Figure 19:
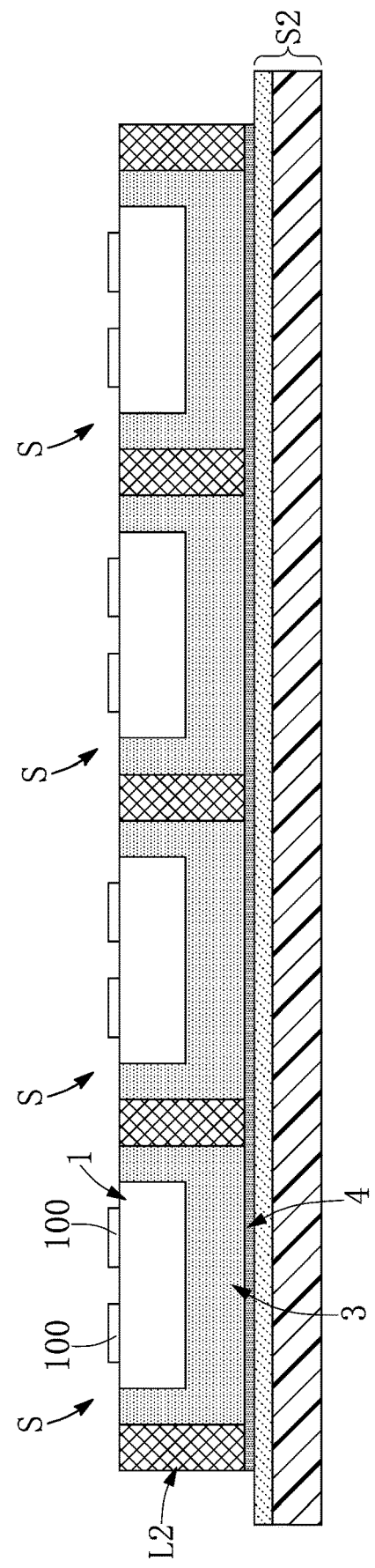
FIG. 19 is a schematic cross-sectional view of step S212 of the method of manufacturing the LED package structure according to the second embodiment of the present disclosure.

Referring to FIG. 12 to FIG. 20, a second embodiment of the present disclosure provides a method of manufacturing an LED package structure S including: firstly, referring to FIG. 12 and FIG. 13, placing a plurality of LED chips 1 on a first removable substrate S1 (step S200); next, referring to FIG. 12 and FIG. 13, forming an initial photoresist layer L1 on the first removable substrate S1 for enclosing the LED chips 1 (step S202); then, referring to FIG. 12, FIG. 13 and FIG. 14, removing a part of the initial photoresist layer L1 to form a patterned photoresist layer L2 for surrounding each of the LED chips 1, the patterned photoresist layer L2 having a plurality of receiving spaces R for respectively receiving the LED chips 1 (step S204); afterwards, referring to FIG. 12 and FIG. 15, respectively forming a plurality of quantum dot material layers 3 inside the receiving spaces R (step S206); next, referring to FIG. 12 and FIG. 16, forming a blue light scattering material 4a (or a blue light absorbing material) on the patterned photoresist layer L2 and the quantum dot material layers 3, the blue light scattering material 4a including a plurality of blue light scattering material layers 4 (step S208); then, referring to FIG. 12, FIG. 17 and FIG. 18, attaching the blue light scattering material 4a that includes the blue light scattering material layers 4 to a second removable substrate S2 (step S210); afterwards, referring to FIG. 12, FIG. 18 and FIG. 19, removing the first removable substrate S1 (step S212); and referring to FIG. 12, FIG. 19 and FIG. 20, separating the LED package structure S from the second removable substrate S2 and the patterned photoresist layer L2 (step S214). In addition, the LED package structure S can be disposed on a circuit substrate P through conductive materials (such as solder balls or solder paste).

For example, the first removable substrate S1 includes a first carrying substrate and a first adhesive layer (such as a UV release film, or a thermal release film) disposed on the first carrying substrate, the second removable substrate S1 includes a second carrying substrate and a second adhesive layer (such as a UV release film, or a thermal release film) disposed on the second carrying substrate, and the LED chip can be any blue LED chip for generating blue light. Moreover, when quantum dot glue is filled in the receiving space R and solidified by curing as so to form the quantum dot material layers 3, the quantum dot material layers 3 can be formed by hydrophilic quantum dot glue. Furthermore, the blue light scattering material layer 4 can be made of the blue light scattering material 4a (such as $TiO_2$, $SiO_2$, or $ZrO_2$ etc.) that has a thickness ranging from 100 nm to 5 µm for increasing a blue light scattering effect of the present disclosure (that is to say, the blue light can be scattered by the blue light scattering material layer 4 and then be returned to the quantum dot material layers 3), so that a wavelength conversion efficiency of the blue light passing through the quantum dot material layer 3 can be directly increased due to the increased blue light scattering effect. It should be noted that the blue light scattering material layer 4 can be replaced by a blue light absorbing material layer (such as being made of an organic material) for increasing a blue light absorbing effect, or by a mixing structure formed by mixing the blue light absorbing material layer and the blue light scattering material layer 4, so that a possibility of the blue light passing through the blue light absorbing material layer can be reduced in order to indirectly increase a wavelength conversion effect provided by the quantum dot material layer 3. Furthermore, in the step S214, the LED package structure S can be separated from the second removable substrate S2 and the patterned photoresist layer L2 by laser processing, the blue light scattering material layers 4 can also be separated from each other by removing a part of the blue light scattering material 4a, and the protective layer 2 can be divided into a plurality of sections. However, the aforementioned description is merely an example, and is not meant to limit the scope of the present disclosure.

Moreover, referring to FIG. 19 and FIG. 20, the second embodiment of the present disclosure further provides an LED package structure S including an LED chip 1, a quantum dot material layer 3, and a blue light scattering material layer 4. More particularly, the LED chip 1 has two exposed conductive pads 100, the quantum dot material layer 3 is used for enclosing the LED chip 1, and the blue light scattering material layer 4 is disposed on the quantum dot material layer 3. For example, the LED chip 1 has a bottom side 1001, a top side 1002, and a peripheral surface 1003 connected between the bottom side 1001 and the top side 1002, and the top side 1002 and the peripheral surface 1003 of the LED chip 1 are covered by the quantum dot material layer 3. In addition, the bottom side 1001 of the LED chip 1 is not covered by the quantum dot material layer 3, and the two conductive pads 100 are disposed on the bottom side 1001 of the LED chip 1. Moreover, a top surface 3001 of the quantum dot material layer 3 is covered by the blue light scattering material layer 4, and a peripheral surface 3003 of the quantum dot material layer 3 is not covered by the blue light scattering material layer 4. However, the aforementioned description is merely an example, and is not meant to limit the scope of the present disclosure.

Furthermore, as shown in FIG. 20, the second embodiment of the present disclosure further provides an LED display Z including a circuit substrate P, a plurality of LED groups C, and a black matrix M. More particularly, the LED groups C are disposed on the circuit substrate P and electrically connected to the circuit substrate P, the black matrix M is disposed on the circuit substrate P for surrounding each of the LED groups C, and the LED group C can be one of a blue LED chip 1B or an LED package structure S. Moreover, when the LED group C is the LED package structure S, the LED package structure S includes an LED chip 1 (such as a blue LED chip) having two exposed conductive pads 100, a quantum dot material layer 3 enclosing the LED chip 1, and a blue light scattering material layer 4 disposed on the quantum dot material layer 3. For example, when the LED package structure S is a red LED package structure SR, the LED chip 1 is a blue LED chip, and the quantum dot material layer 3 is a red quantum dot material layer. When the LED package structure S is a green LED package structure SG the LED chip 1 is a blue LED chip, and the quantum dot material layer 3 is a green quantum dot material layer. However, the aforementioned description is merely an example, and is not meant to limit the scope of the present disclosure.

Third Embodiment

Figure 21:
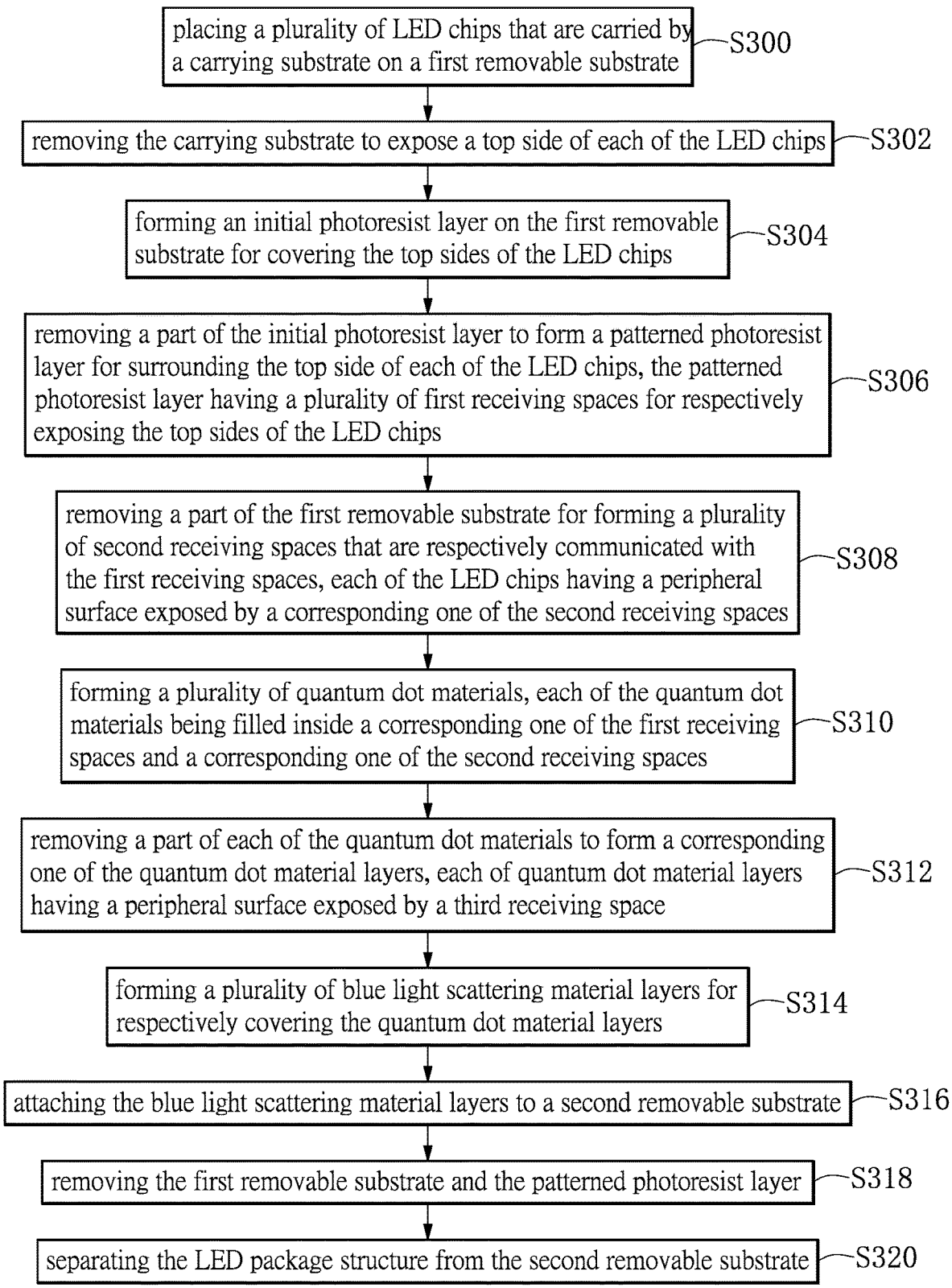
FIG. 21 is a flowchart of a method of manufacturing an LED package structure according to a third embodiment of the present disclosure.
Figure 22:
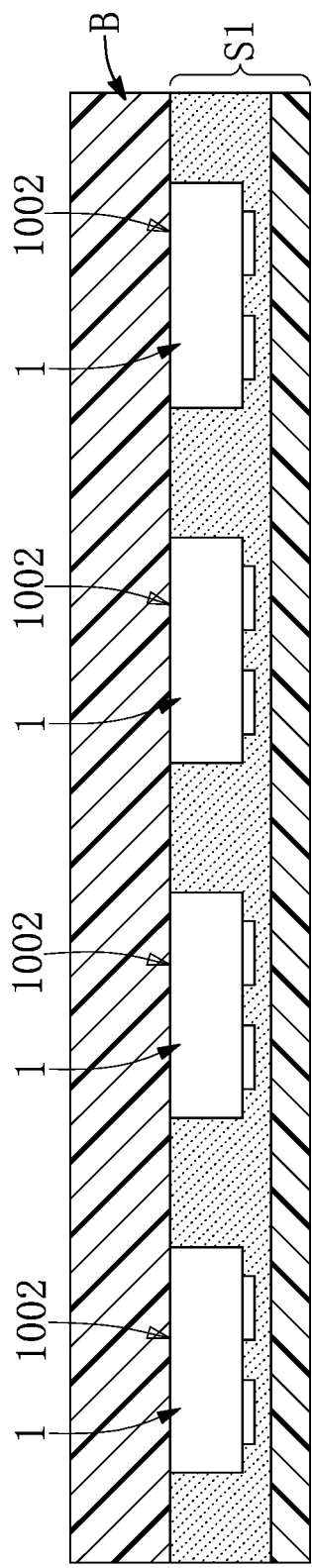
FIG. 22 is a schematic cross-sectional view of step S300 of the method of manufacturing the LED package structure according to the third embodiment of the present disclosure.
Figure 23:
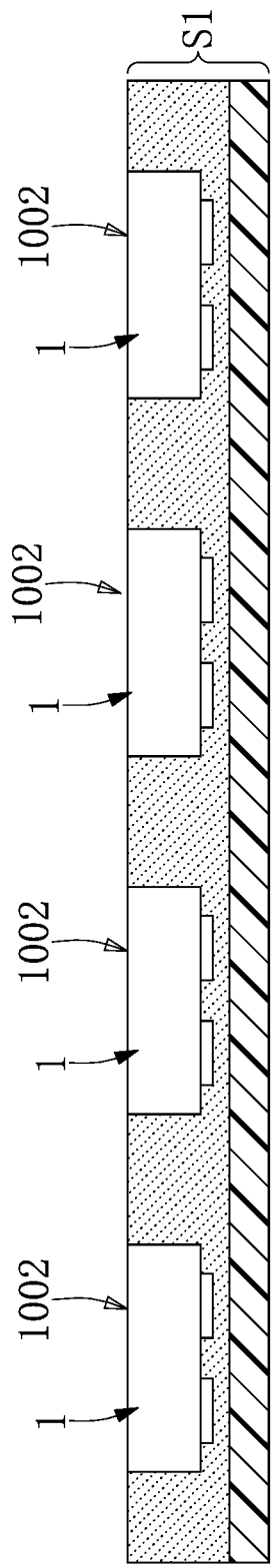
FIG. 23 is a schematic cross-sectional view of step S302 of the method of manufacturing the LED package structure according to the third embodiment of the present disclosure.
Figure 24:
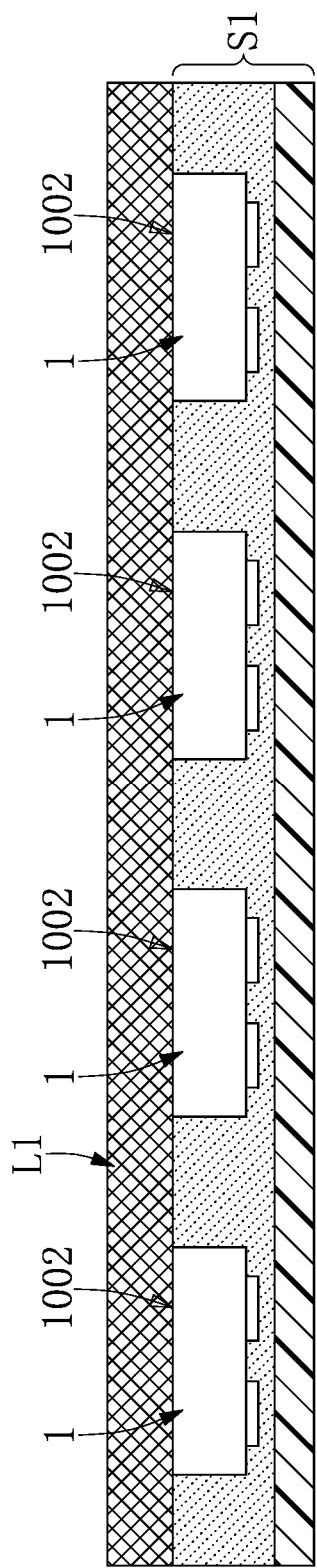
FIG. 24 is a schematic cross-sectional view of step S304 of the method of manufacturing the LED package structure according to the third embodiment of the present disclosure.
Figure 25:
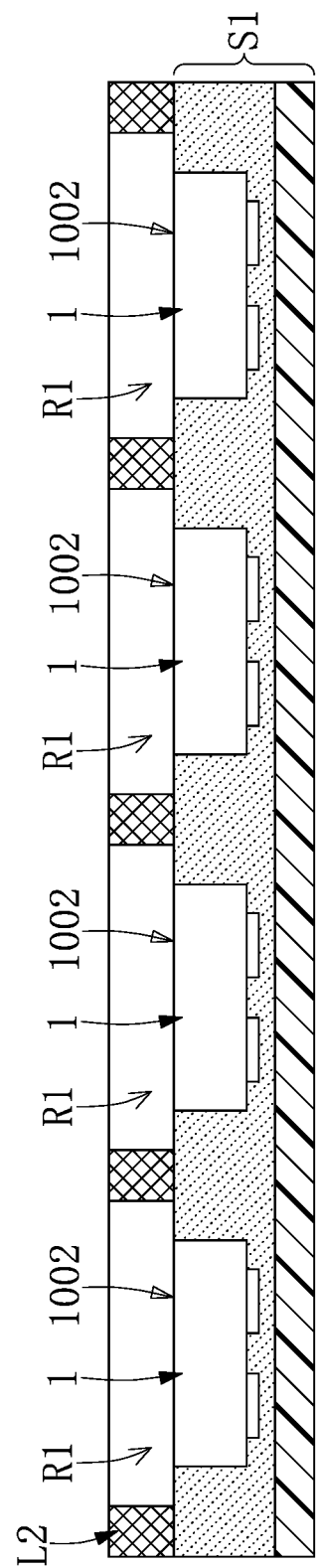
FIG. 25 is a schematic cross-sectional view of step S306 of the method of manufacturing the LED package structure according to the third embodiment of the present disclosure.
Figure 26:
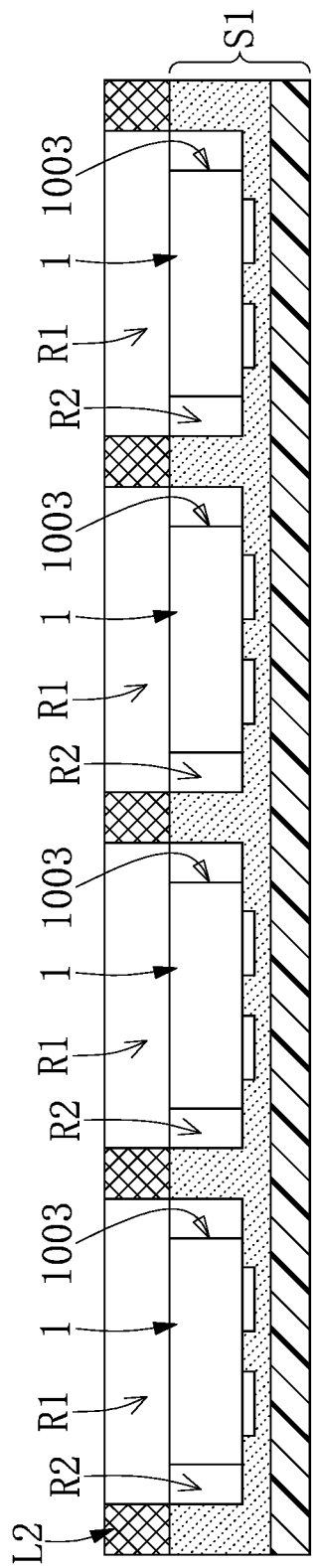
FIG. 26 is a schematic cross-sectional view of step S308 of the method of manufacturing the LED package structure according to the third embodiment of the present disclosure.
Figure 27:
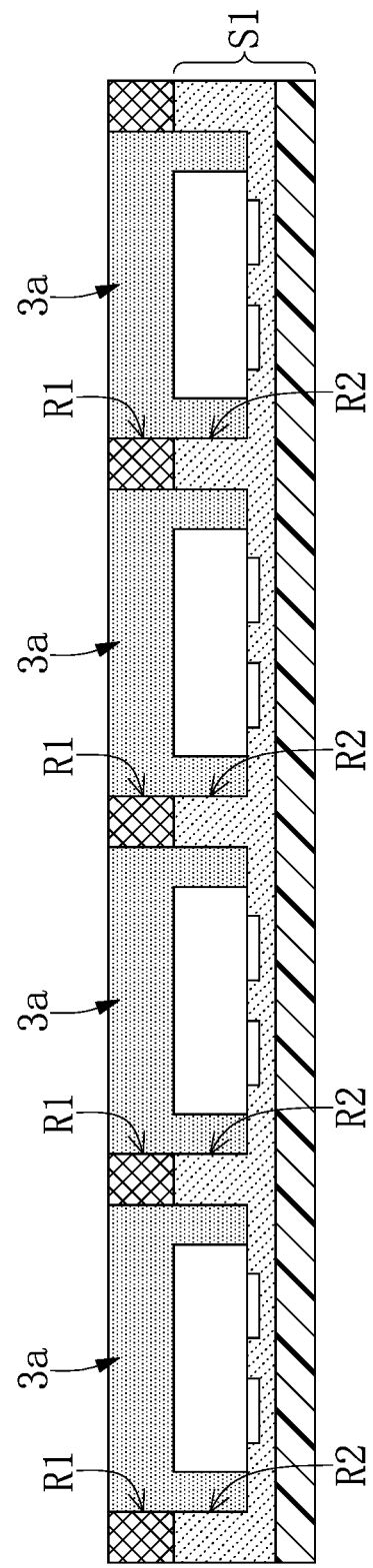
FIG. 27 is a schematic cross-sectional view of step S310 of the method of manufacturing the LED package structure according to the third embodiment of the present disclosure.
Figure 28:
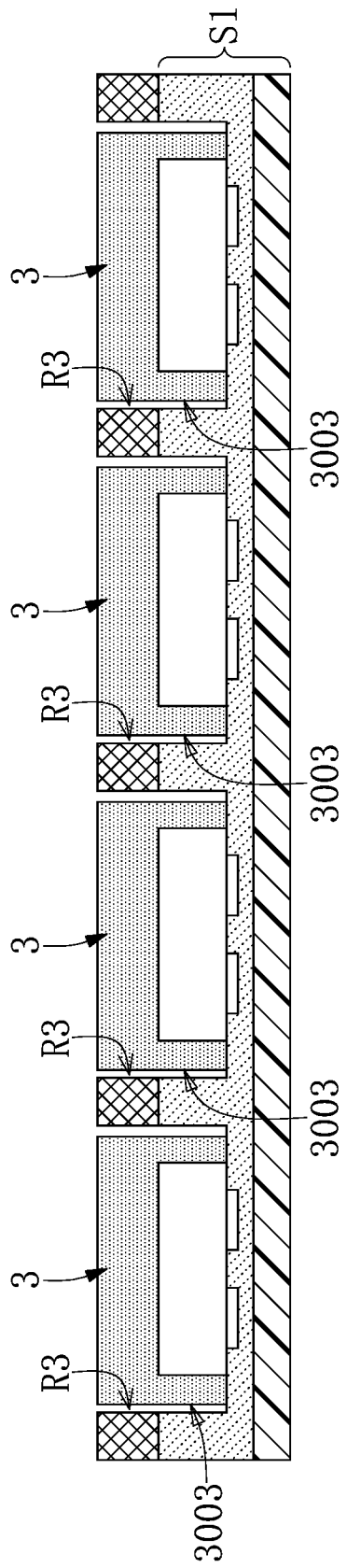
FIG. 28 is a schematic cross-sectional view of step S312 of the method of manufacturing the LED package structure according to the third embodiment of the present disclosure.
Figure 29:
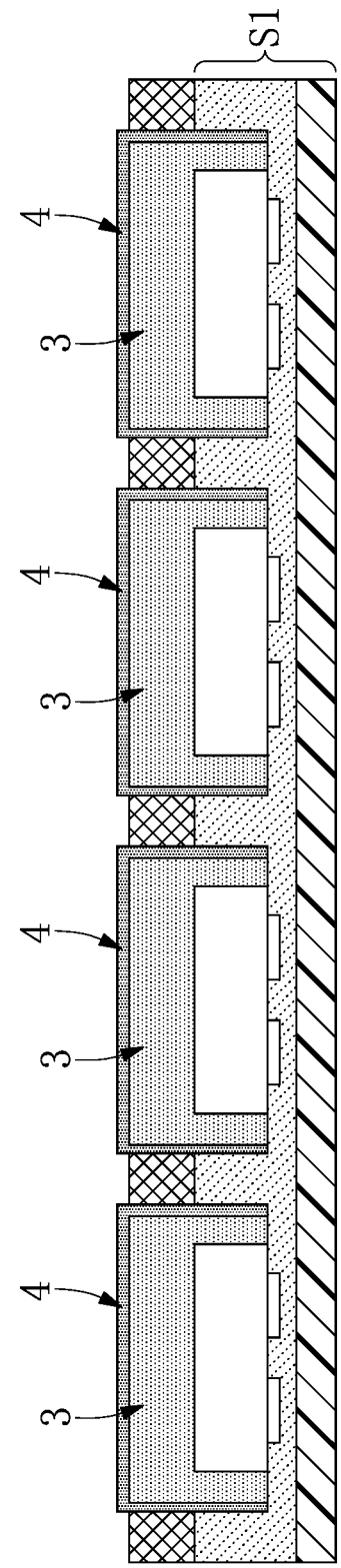
FIG. 29 is a schematic cross-sectional view of step S314 of the method of manufacturing the LED package structure according to the third embodiment of the present disclosure.
Figure 30:
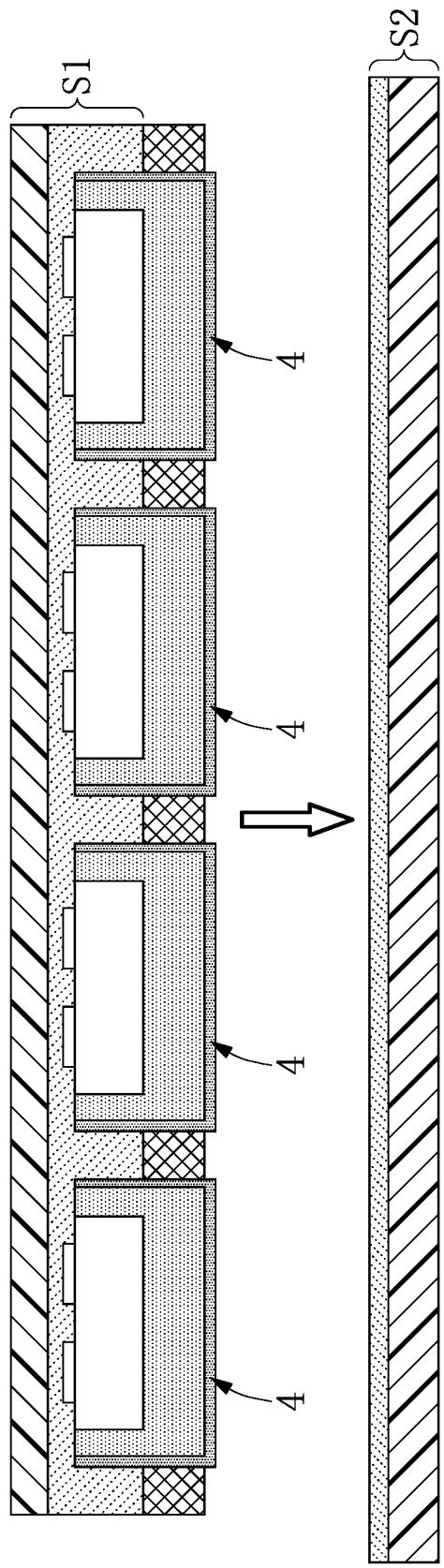
FIG. 30 is a schematic cross-sectional view showing the method of manufacturing the LED package structure before step S316 is performed according to the third embodiment of the present disclosure.
Figure 31:
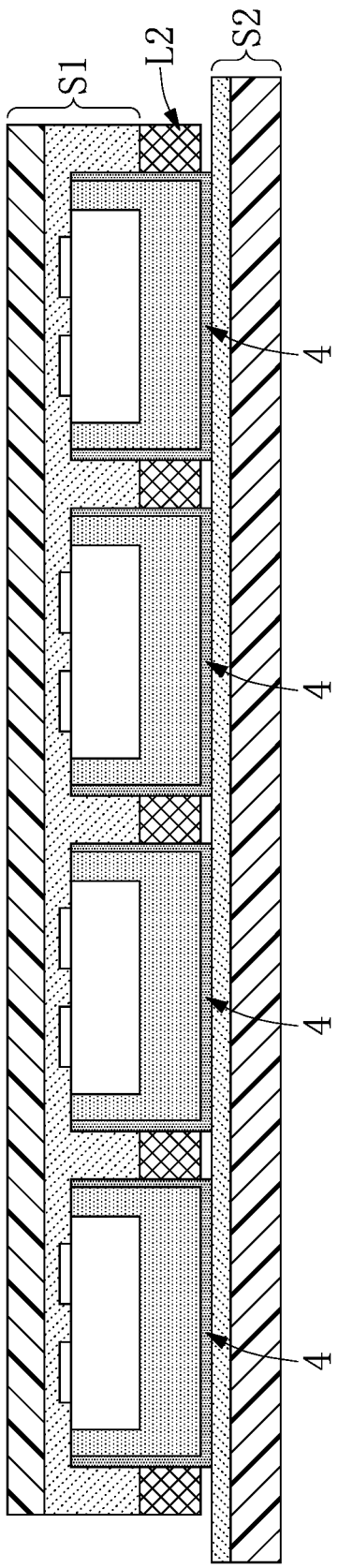
FIG. 31 is a schematic cross-sectional view showing the method of manufacturing the LED package structure after step S316 is performed according to the third embodiment of the present disclosure.
Figure 32:
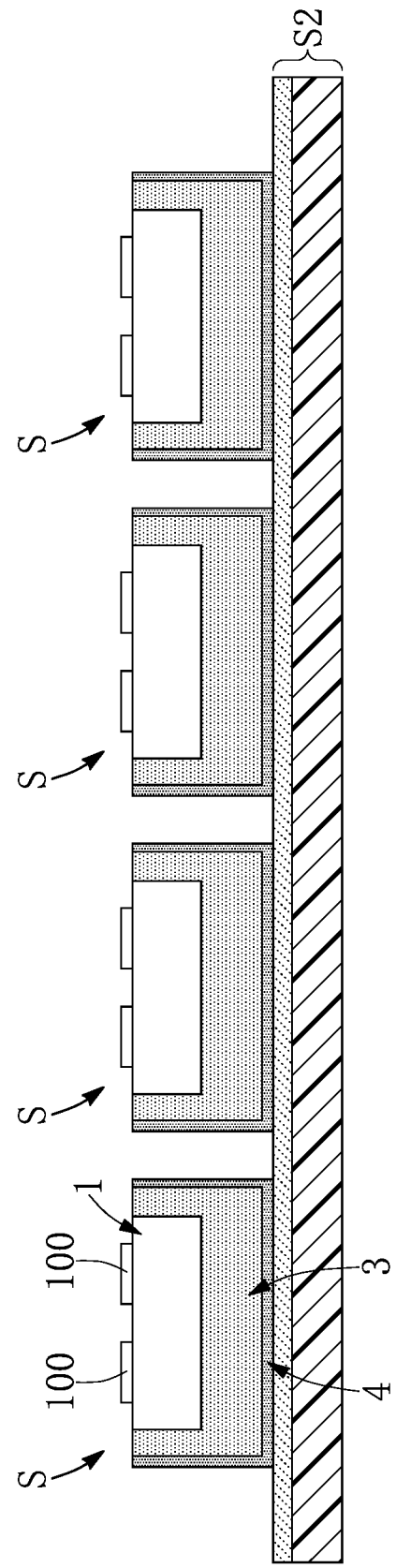
FIG. 32 is a schematic cross-sectional view of step S318 of the method of manufacturing the LED package structure according to the third embodiment of the present disclosure.

Referring to FIG. 21 to FIG. 33, a third embodiment of the present disclosure provides a method of manufacturing an LED package structure S including: firstly, referring to FIG. 21 and FIG. 22, placing a plurality of LED chips 1 that are carried by a carrying substrate B on a first removable substrate S1 (step S300); next, referring to FIG. 21, FIG. 22 and FIG. 23, removing the carrying substrate B to expose a top side 1002 of each of the LED chips 1 (step S302); then, referring to FIG. 21 and FIG. 24, forming an initial photoresist layer L1 on the first removable substrate S1 for covering the top sides 1002 of the LED chips 1 (step S304); afterwards, referring to FIG. 21, FIG. 24 and FIG. 25, removing a part of the initial photoresist layer L1 to form a patterned photoresist layer L2 for surrounding the top side 1002 of each of the LED chips 1, the patterned photoresist layer L2 having a plurality of first receiving spaces R1 for respectively exposing the top sides 1002 of the LED chips 1 (step S306); next, referring to FIG. 21 and FIG. 26, removing a part of the first removable substrate S1 for forming a plurality of second receiving spaces R2 that are respectively communicated with the first receiving spaces R1, each of the LED chips 1 having a peripheral surface 1003 exposed by a corresponding one of the second receiving spaces R2 (step S308); then, referring to FIG. 21 and FIG. 27, forming a plurality of quantum dot materials 3a, each of the quantum dot materials 3a being filled inside a corresponding one of the first receiving spaces R1 and a corresponding one of the second receiving spaces R2 (step S310); afterwards, referring to FIG. 21, FIG. 2 and FIG. 28, removing a part of each of the quantum dot materials 3a to form a corresponding one of the quantum dot material layers 3, each of quantum dot material layers 3 having a peripheral surface 3003 exposed by a third receiving space R3 (step S312); next, referring to FIG. 21 and FIG. 29, forming a plurality of blue light scattering material layers 4 for respectively covering the quantum dot material layers 3 (step S314); then, referring to FIG. 21, FIG. 30 and FIG. 31, attaching the blue light scattering material layers 4 to a second removable substrate S2 (step S316); afterwards, referring to FIG. 21, FIG. 31 and FIG. 32, removing the first removable substrate Si and the patterned photoresist layer L2 (step S318); next, referring to FIG. 21, FIG. 32 and FIG. 33, separating the LED package structure S from the second removable substrate S2 (step S320). In addition, the LED package structure S can be disposed on a circuit substrate P through conductive materials (such as solder balls or solder paste).

For example, the first removable substrate S1 includes a first carrying substrate and a first adhesive layer (such as a UV release film, or a thermal release film) disposed on the first carrying substrate, the second removable substrate S1 includes a second carrying substrate and a second adhesive layer (such as a UV release film, or a thermal release film) disposed on the second carrying substrate, and the LED chip can be any blue LED chip for generating blue light. Moreover, when quantum dot glue is filled in the receiving space R and solidified by curing as so to form the quantum dot material layers 3, the quantum dot material layers 3 can be formed by hydrophilic quantum dot glue. Furthermore, the blue light scattering material layer 4 can be made of a blue light scattering material 4a (such as $TiO_2$, $SiO_2$, or $ZrO_2$ etc.) that has a thickness ranging from 100 nm to 5 μm for increasing a blue light scattering effect of the present disclosure (that is to say, the blue light can be scattered by the blue light scattering material layer 4 and then be returned to the quantum dot material layers 3), so that a wavelength conversion efficiency of the blue light passing through the quantum dot material layer 3 can be directly increased due to the increased blue light scattering effect. It should be noted that the blue light scattering material layer 4 can be replaced by a blue light absorbing material layer (which is made of an organic material capable of increasing a blue light absorbing effect), or a mixture of the blue light scattering material 4a and a blue light absorbing material can be used, so that a possibility of the blue light passing through the blue light absorbing material layer can be reduced in order to indirectly increase a wavelength conversion effect provided by the quantum dot material layer 3. Furthermore, in the step S320, the LED package structure S can be separated from the second removable substrate S2 by laser processing. However, the aforementioned description is merely an example, and is not meant to limit the scope of the present disclosure.

Moreover, referring to FIG. 32 and FIG. 33, the third embodiment of the present disclosure further provides an LED package structure S including an LED chip 1, a quantum dot material layer 3, and a blue light scattering material layer 4. More particularly, the LED chip 1 has two exposed conductive pads 100, the quantum dot material layer 3 is used for enclosing the LED chip 1, and the blue light scattering material layer 4 is disposed on the quantum dot material layer 3. For example, the LED chip 1 has a bottom side 1001, a top side 1002, and a peripheral surface 1003 connected between the bottom side 1001 and the top side 1002, and the top side 1002 and the peripheral surface 1003 of the LED chip 1 are covered by the quantum dot material layer 3. In addition, the bottom side 1001 of the LED chip 1 is not covered by the quantum dot material layer 3, and the two conductive pads 100 are disposed on the bottom side 1001 of the LED chip 1. Moreover, the quantum dot material layer 3 has a top surface 3001, a bottom surface 3002, and a peripheral surface 3003 connected between the top surface 3001 and the bottom surface 3002, the top surface 3001 and the peripheral surface 3003 of the quantum dot material layer 3 are covered by the blue light scattering material layer 4, and a bottom surface 4002 of the blue light scattering material layer 4 and the bottom surface 3002 of the quantum dot material layer 3 are flush with each other. However, the aforementioned description is merely an example, and is not meant to limit the scope of the present disclosure.

Furthermore, as shown in FIG. 33, the third embodiment of the present disclosure further provides an LED display Z including a circuit substrate P, a plurality of LED groups C, and a black matrix M. More particularly, the LED groups C are disposed on the circuit substrate P and electrically connected to the circuit substrate P, the black matrix M is disposed on the circuit substrate P for surrounding each of the LED groups C, and the LED group C can be one of a blue LED chip 1B or an LED package structure S. Moreover, when the LED group C is the LED package structure S, the LED package structure S includes an LED chip 1 (such as a blue LED chip) having two exposed conductive pads 100, a quantum dot material layer 3 enclosing the LED chip 1, and a blue light scattering material layer 4 disposed on the quantum dot material layer 3. For example, when the LED package structure S is a red LED package structure SR, the LED chip 1 is a blue LED chip, and the quantum dot material layer 3 is a red quantum dot material layer. When the LED package structure S is a green LED package structure SG, the LED chip 1 is a blue LED chip, and the quantum dot material layer 3 is a green quantum dot material layer. However, the aforementioned description is merely an example, and is not meant to limit the scope of the present disclosure.

Beneficial Effects of the Embodiments

In conclusion, in the LED package structure S and the LED display Z provided by the present disclosure, by virtue of "the quantum dot material layer 3 for enclosing the LED chip 1" and "the blue light scattering material layer 4 being disposed on the quantum dot material layer 3", a blue light scattering effect of the present disclosure can be increased by using the blue light scattering material layer 4, so that a wavelength conversion efficiency of the blue light passing through the quantum dot material layer 3 can be directly increased due to the increased blue light scattering effect. It should be noted that the blue light scattering material layer 4 can be replaced by a blue light absorbing material layer for increasing a blue light absorbing effect, so that a possibility of the blue light passing through the blue light absorbing material layer can be reduced in order to indirectly increase a wavelength conversion effect provided by the quantum dot material layer 3.

Furthermore, in the method of manufacturing the LED package structure provided by the present disclosure, by virtue of "forming a plurality of quantum dot material layers 3 for respectively enclosing the LED chips 1" and "respectively forming a plurality of blue light scattering material layers 4 on the quantum dot material layers 3", a blue light scattering effect of the present disclosure can be increased by using the blue light scattering material layer 4, so that a wavelength conversion efficiency of the blue light passing through the quantum dot material layer 3 can be directly increased due to the increased blue light scattering effect. It should be noted that the blue light scattering material layer 4 can be replaced by a blue light absorbing material layer for increasing a blue light absorbing effect, so that a possibility of the blue light passing through the blue light absorbing material layer can be reduced in order to indirectly increase a wavelength conversion effect provided by the quantum dot material layer 3.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode (LED) package structure, comprising:
    an LED chip having two exposed conductive pads;
    a quantum dot material layer enclosing the LED chip; and
    a blue light scattering material layer disposed on the quantum dot material layer,
    wherein a bottom surface of the blue light scattering material layer and a bottom side of the LED chip are flush with each other.

2. The LED package structure according to claim 1, wherein the LED chip has the bottom side, a top side, and a peripheral surface connected between the bottom side and the top side, the top side and the peripheral surface of the LED chip are covered by a protective layer, and the protective layer is covered by the quantum dot material layer.

3. The LED package structure according to claim 2, wherein the bottom side of the LED chip is not covered by the protective layer, and the two conductive pads are disposed on the bottom side of the LED chip.

4. The LED package structure according to claim 2, wherein a top surface of the quantum dot material layer is covered by the blue light scattering material layer, and a peripheral surface of the quantum dot material layer is not covered by the blue light scattering material layer.

5. The LED package structure according to claim 1, wherein the LED chip has a bottom side, a top side, and a peripheral surface connected between the bottom side and the top side, and the top side and the peripheral surface of the LED chip are covered by the quantum dot material layer.

6. The LED package structure according to claim 5, wherein the bottom side of the LED chip is not covered by the quantum dot material layer, and the two conductive pads are disposed on the bottom side of the LED chip.

7. The LED package structure according to claim 5, wherein a top surface of the quantum dot material layer is covered by the blue light scattering material layer, and a peripheral surface of the quantum dot material layer is not covered by the blue light scattering material layer.

8. The LED package structure according to claim 1, wherein the quantum dot material layer has a top surface, a bottom surface, and a peripheral surface connected between the top surface and the bottom surface, the top surface and the peripheral surface of the quantum dot material layer are covered by the blue light scattering material layer, and a bottom surface of the blue light scattering material layer and the bottom surface of the quantum dot material layer are flush with each other.

9. The LED package structure according to claim 1, wherein the blue light scattering material layer is replaced by a blue light absorbing material layer.

10. A light-emitting diode (LED) display, comprising:
- a circuit substrate;
- a plurality of LED groups disposed on the circuit substrate and electrically connected to the circuit substrate; and
- a black matrix disposed on the circuit substrate for surrounding each of the LED groups;
- wherein the LED group is one of a blue LED chip or an LED package structure;
- wherein, when the LED group is the LED package structure, the LED package structure includes an LED chip having two exposed conductive pads, a quantum dot material layer enclosing the LED chip, and a blue light scattering material layer disposed on the quantum dot material layer, and
- wherein a bottom surface of the blue light scattering material layer and a bottom side of the LED chip are flush with each other, and the blue light scattering material layer is not connected to the circuit substrate.

11. The LED display according to claim 10, wherein, when the LED package structure is a red LED package structure, the LED chip is a blue LED chip, and the quantum dot material layer is a red quantum dot material layer;
wherein the blue light scattering material layer is replaced by a blue light absorbing material layer.

12. The LED display according to claim 10, wherein, when the LED package structure is a green LED package structure, the LED chip is a blue LED chip, and the quantum dot material layer is a green quantum dot material layer;
wherein the blue light scattering material layer is replaced by a blue light absorbing material layer.

* * * * *